(12) United States Patent
Oh et al.

(10) Patent No.: US 8,461,760 B1
(45) Date of Patent: Jun. 11, 2013

(54) THIN FILM ENCAPSULATION FOR FLAT PANEL DISPLAY DEVICE AND METHOD OF MANUFACTURING THIN FILM ENCAPSULATION STRUCTURE

(71) Applicant: Samsung Display Co., Ltd., Yongin-si (KR)

(72) Inventors: Min-Ho Oh, Yongin-si (KR);
Yoon-Hyeung Cho, Yongin-si (KR);
Yong-Tak Kim, Yongin-si (KR);
So-Young Lee, Yongin-si (KR);
Sang-Hwan Cho, Yongin-si (KR);
Byoung-Duk Lee, Yongin-si (KR);
Sun-Young Jung, Yongin-si (KR);
Yun-Ah Chung, Yongin-si (KR);
Soo-Youn Kim, Yongin-si (KR);
Dong-Jin Kim, Yongin-si (KR);
Ji-Young Moon, Yongin-si (KR);
Seung-Yong Song, Yongin-si (KR);
Jong-Hyuk Lee, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/661,024

(22) Filed: Oct. 25, 2012

(30) Foreign Application Priority Data

May 17, 2012 (KR) .................. 10-2012-0052595

(51) Int. Cl.
*H05B 33/04* (2006.01)
(52) U.S. Cl.
USPC ............................................. 313/512; 428/68

(58) Field of Classification Search
USPC ............................................. 313/512; 428/68
See application file for complete search history.

(56) References Cited

U.S. PATENT DOCUMENTS

| | | | |
|---|---|---|---|
| 7,183,197 B2 * | 2/2007 | Won et al. | 438/622 |
| 7,214,600 B2 | 5/2007 | Won et al. | |
| 2004/0101636 A1 * | 5/2004 | Kuhr et al. | 427/569 |
| 2006/0001700 A1 * | 1/2006 | Bertelsen et al. | 347/50 |
| 2009/0252975 A1 | 10/2009 | Lee et al. | |
| 2010/0021691 A1 | 1/2010 | Lee et al. | |
| 2011/0097533 A1 * | 4/2011 | Li et al. | 428/68 |

FOREIGN PATENT DOCUMENTS

| | | |
|---|---|---|
| KR | 10-2009-0106277 | 10/2009 |
| KR | 10-2010-0010726 | 2/2010 |

* cited by examiner

*Primary Examiner* — Mary Ellen Bowman
(74) *Attorney, Agent, or Firm* — Christie, Parker & Hale, LLP

(57) ABSTRACT

Thin film encapsulation for a flat panel display device and a method of manufacturing the thin film encapsulation structure. The thin film encapsulation structure of the flat panel display device includes thin film layers covering a display unit formed on a substrate, wherein the thin film layers comprise a plurality of inorganic layers and a hexamethyldisiloxane (HMDSO) layer interposed between the inorganic layers. Accordingly, as multiple layers of the thin film encapsulation structure may be formed in a single chamber, the manufacturing process may be simplified, and also, as the HMDSO layer, which is flexible, absorbs stresses, a risk of cracks occurring may also be reduced.

13 Claims, 2 Drawing Sheets

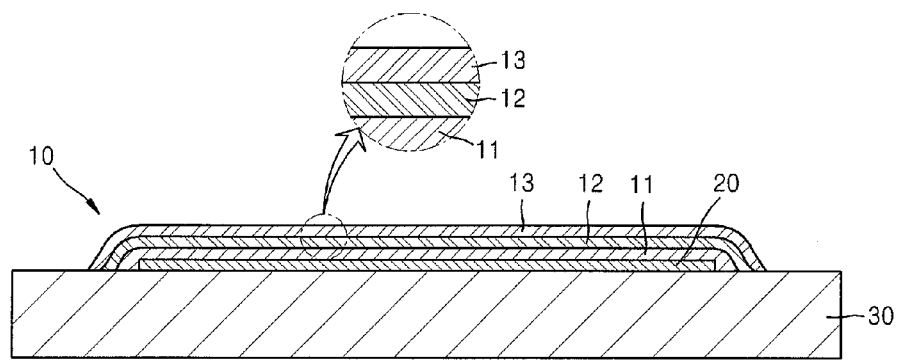
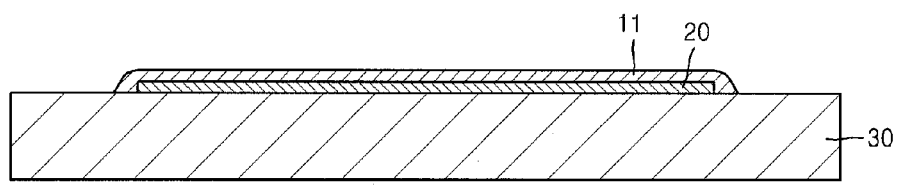
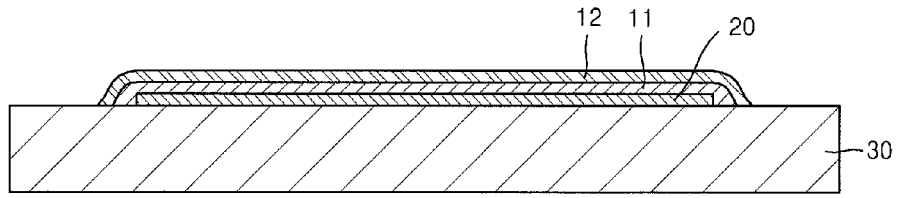
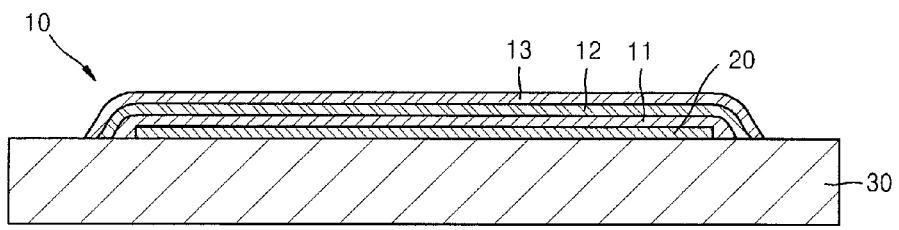

THIN FILM ENCAPSULATION FOR FLAT PANEL DISPLAY DEVICE AND METHOD OF MANUFACTURING THIN FILM ENCAPSULATION STRUCTURE

CROSS-REFERENCE TO RELATED PATENT APPLICATION

This application claims priority to and the benefit of Korean Patent Application No. 10-2012-0052595, filed on May 17, 2012, in the Korean Intellectual Property Office, the disclosure of which is incorporated herein in its entirety by reference.

BACKGROUND

1. Field

Aspects of the present invention relate generally to a thin film encapsulation structure for a flat panel display device and a method of manufacturing the thin film encapsulation structure.

2. Description of the Related Art

A flat panel display device, such as an organic light emitting display device, may be thin and flexible due to characteristics thereof, and, thus, research is being conducted into flat panel display devices, such as the organic light emitting display device.

Display units of the organic light emitting display device type may deteriorate due to penetration of oxygen or water. Thus, in order to prevent or reduce the penetration of oxygen and/or water from the outside, an encapsulation structure that encapsulates the display unit to protect the same may be provided.

To this end, a thin film encapsulation structure that has a multi-layer structure in which an organic layer and an inorganic layer may be alternately stacked to cover the display unit may be provided. That is, organic and inorganic layers may be alternately stacked on the display unit on the substrate to encapsulate the display unit. Here, the organic layer may allow for flexibility of a flat panel display device, and the inorganic layer may prevent penetration of oxygen and/or water.

To alternately stack the organic and inorganic layers, first, an organic layer may be formed by being mounted on a substrate, on which the display unit is formed, in a chamber for depositing the organic layer. The substrate may then be moved to another chamber for depositing an inorganic layer to form the inorganic layer. Operations of moving and mounting the substrate, and depositing layers may then be repeated. While the order of forming organic and inorganic layers may be modified, since the substrate is moved from or to the chambers for depositing an organic layer and an inorganic layer, the manufacturing process may be considerably burdensome and complicated.

To address the above phenomenon, a thin film encapsulation structure may be formed using only an inorganic layer. However, in this case, this thin film encapsulation film may not be flexible and have high fragility, and even when a small particle is mixed thereinto, stress around the particle may be concentrated and create cracks.

Accordingly, a method of reducing the risk of cracks occurring and simplifying the manufacturing process is required.

SUMMARY

Aspects of embodiments of the present invention provide thin film encapsulation for a flat panel display device and a method of manufacturing a thin film encapsulation structure, which simplifies the manufacturing process and reduces a risk of cracks occurring.

According to an aspect of the present invention, there is provided a thin film encapsulation structure of a flat panel display device, the thin film encapsulation structure including a plurality of thin film layers covering a display unit on a substrate, wherein the thin film layers include a plurality of inorganic layers and a hexamethyldisiloxane (HMDSO) layer interposed between the inorganic layers.

A material of the inorganic layers may include silicon nitride (SiNx) or silicon oxide (SiOx).

The HMDSO layer may have a gradient in which a density of the HMDSO layer increases away from a boundary line with respect to the inorganic layers.

In some embodiments, the thin film layers further include a plurality of HMDSO layers including the HMDSO layer, wherein the plurality of inorganic layers includes at least three inorganic layers, and wherein one of the plurality of HMDSO layers is interposed between adjacent ones of the inorganic layers.

According to another aspect of the present invention, there is provided a method of manufacturing a thin film encapsulation structure of a flat panel display device, the method including: forming a plurality of inorganic layers protecting a display unit on a substrate; and forming a hexamethyldisiloxane (HMDSO) layer between the inorganic layers.

A material of the inorganic layers may include silicon nitride (SiNx) or silicon oxide (SiOx).

The HMDSO layer may have a gradient in which a density of the HMDSO layer increases away from a boundary line with respect to the inorganic layers.

The inorganic layers and the HMDSO layer may be formed in a single chamber.

In some embodiments, the method may further include forming a plurality of HMDSO layers including the HMDSO layer, wherein forming the inorganic layers includes forming at least three inorganic layers, and wherein one of the plurality of HDMSO layers is formed between adjacent ones of the inorganic layers.

According to another aspect of the present invention, there is provided a flat panel display device including: a substrate; a display unit on the substrate; a plurality of inorganic layers covering the display unit; and a hexamethyldisiloxane (HMDSO) layer interposed between adjacent ones of the inorganic layers.

A material of the inorganic layers may include silicon nitride (SiNx) or silicon oxide (SiOx).

The HMDSO layer may have a gradient in which a density of the HMDSO layer increases away from a boundary line with respect to the inorganic layers.

In some embodiments, the flat panel display device further includes a plurality of HMDSO layers including the HMDSO layer, wherein the plurality of inorganic layers includes at least three inorganic layers, and wherein one of the plurality of HMDSO layers is interposed between each of the adjacent ones of the inorganic layers.

BRIEF DESCRIPTION OF THE DRAWINGS

The above and other features and aspects of embodiments of the present invention will become more apparent by describing, in detail, exemplary embodiments thereof with reference to the attached drawings in which:

FIG. 1 is a cross-sectional view illustrating a flat panel display device on which a thin film encapsulation structure is formed, according to an embodiment of the present invention;

FIGS. 2A through 2C are cross-sectional views illustrating a method of manufacturing the thin film encapsulation structure illustrated in FIG. 1.

DETAILED DESCRIPTION

Figure 3:
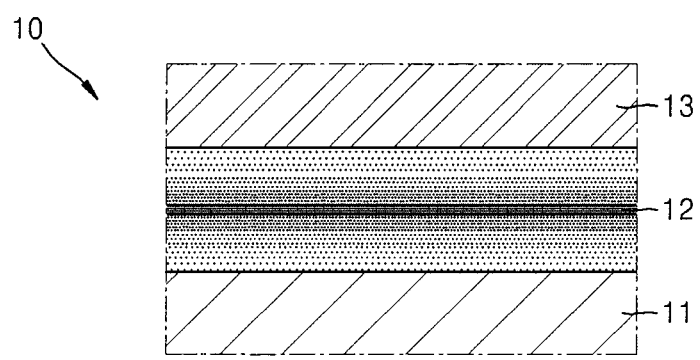
FIG. 3 is a partial cross-sectional view of a thin film encapsulation structure according to an embodiment of the present invention.

Aspects of embodiments of the present invention will now be described more fully with reference to the accompanying drawings, in which exemplary embodiments of the invention are shown. The present invention may, however, be embodied in many different forms and should not be construed as being limited to the embodiments set forth herein; rather, these embodiments are provided so that this disclosure will be thorough and complete, and will fully convey the concept of the invention to those skilled in the art. The terminology used herein is for the purpose of describing particular embodiments only, and is not intended to be limiting. In addition, when an element is referred to as being "on" another element, it may be directly on the another element or may be indirectly on the another element with one or more intervening elements interposed therebetween.

A thin film encapsulation for a flat panel display device and method of manufacturing the same according to exemplary embodiments of the present invention will now be described in detail with reference to the attached drawings. In the description, the same or corresponding elements are denoted with the same reference numerals, and their descriptions may not be repeated FIG. 1 is a cross-sectional view illustrating a flat panel display device on which a thin film encapsulation structure 10 is formed according to an embodiment of the present invention.

As illustrated in FIG. 1, the flat panel display device includes a display unit 20 formed on a substrate 30 (e.g., on a surface of the substrate 30), wherein an image is formed on the display unit 20 during an operation of the flat panel display device. A thin film encapsulation structure 10 covers the display unit 20 to protect the display unit (e.g., to protect the display unit 20 from oxygen and/or water).

The thin film encapsulation structure 10 includes a plurality of inorganic layers 11 and 13 covering the display unit 20 and a hexamethyldisiloxane (HMDSO) layer 12 interposed between the inorganic layers 11 and 13.

Here, the inorganic layers 11 and 13 prevent (or impede or resist) a penetration of oxygen and/or water (or vapor permeability), and the HMDSO layer 12 absorbs stresses of the inorganic layers 11 and 13 and provides flexibility for the thin film encapsulation structure 10.

The inorganic layers 11 and 13 may include (or be formed of) an inorganic material having an excellent moisture-proof (or moisture resistant) capability, such as, silicon nitride (SiNx) or silicon oxide (SiOx).

Also, while the HMDSO layer 12 is substantially an inorganic layer, it has a flexibility characteristic similar to that of an organic layer. Thus, the HMDSO layer 12 may prevent (or reduce or resist) cracks by effectively absorbing stresses of the inorganic layers 11 and 13 due to the flexibility (like that of an organic layer). Additionally, the HDMSO layer 12 may be deposited in the same chamber as the inorganic layers 11 and 13 since the HMDSO layer 12 is substantially an inorganic layer. That is, although the thin film encapsulation structure 10 is a multi-layer structure, the inorganic layers 11 and 13 and the HMDSO layer 12 may all be formed in a single chamber, instead of moving through several chambers.

According to the thin film encapsulation structure formed in the above-described manner, the inorganic layers 11 and 13 prevent (or reduce or resist) penetration of oxygen and/or water from the outside, and the HMDSO layer 12, which has flexibility, absorbs stresses of the inorganic layers 11 and 13, thereby both improving the encapsulation function of the thin film encapsulation structure 10 and further preventing cracks.

According to an embodiment of the present invention, the thin film encapsulation structure 10 of the flat panel display device having the above-described structure may be manufactured in a single chamber according to the following method.

First, as illustrated in FIG. 2A, the substrate 30, on which the display unit 20 is formed, may be mounted in a deposition chamber (not shown) to form a first inorganic layer 11 by, for example, using a chemical vapor deposition (CVD) method.

Then, without moving the substrate 30, the HMDSO layer 12 may be formed in the same chamber, as illustrated in FIG. 2B. As the HMDSO layer 12 is substantially also an inorganic layer, it may be deposited in the same manner without having to move the substrate 30 to another chamber, for example, a chamber for depositing an organic layer.

Then, as illustrated in FIG. 2C, a second inorganic layer 13 may be deposited on the HMDSO layer 12, for example, by using a chemical deposition method in the same chamber. Thus, the thin film encapsulation structure 10 in which the HMDSO layer 12 is between the inorganic layers 11 and 13 is formed.

As a result, the thin film encapsulation structure 10, which has a stable resistance to vapor permeability due to the multi-layer inorganic layers 11 and 13 and has a flexibility due to the HMDSO layer 12, is provided and may be conveniently manufactured in a single chamber.

Additionally, as illustrated in FIG. 3, the HMDSO layer 12 may be formed to have a gradient such that density thereof increases away from a boundary line with respect to the inorganic layers 11 and 13. The HMDSO layer 12 may be formed this way by, for example, performing deposition while adjusting a mixture ratio of an HMDSO and an inorganic layer material. This operation may be performed in order to reduce the probability of deformation of the HMDSO layer 12 as stresses may be concentrated on the boundary line. That is, although the HMDSO layer 12 may be included as a stress control layer, stress may be concentrated on the boundary line, and this may deform the HMDSO layer 12. Thus, a HMDSO density around the boundary line is reduced (e.g., reduced as compared with the HMDSO density closer to the center of the HMDSO layer 12) to increase the characteristics as an inorganic layer so as to reduce the risk of deformation of the HMDSO layer 12 occurring due to stress concentration. Additionally, the HMDSO density may be set to increase toward a center of the HMDSO layer 12 from the boundary line to thereby provide flexibility.

Accordingly, a stable thin film encapsulation structure whereby a deformation probability of the HMDSO layer 12 is also reduced may be formed.

Thus, according to the thin film encapsulation structure described above, as a multi-layer thin film encapsulation structure may be formed in a single chamber, the manufacturing process may be further simplified, and the HMDSO layer, which is flexible, absorbs stresses, and, thus, the risk of cracks occurring may also be effectively reduced.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents. For example, while FIGS. 1-3 illustrate embodiments of the present invention as having two inorganic layers and one HMDSO layer, embodiments of the present invention are not limited thereto, and may include, for example, at least three inorganic layers and a plurality of HMDSO layers, where one of the HMDSO layers is interposed between adjacent ones of the inorganic layers.

What is claimed is:

1. A thin film encapsulation structure of a flat panel display device, the thin film encapsulation structure comprising a plurality of thin film layers covering a display unit on a substrate,
   wherein the thin film layers comprise a plurality of inorganic layers and a hexamethyldisiloxane (HMDSO) layer interposed between the inorganic layers.

2. The thin film encapsulation structure of claim 1, wherein a material of the inorganic layers comprises silicon nitride (SiNx) or silicon oxide (SiOx).

3. The thin film encapsulation structure of claim 1, wherein the HMDSO layer has a gradient in which a density of the HMDSO layer increases away from a boundary line with respect to the inorganic layers.

4. The thin film encapsulation structure of claim 1,
   wherein the thin film layers further comprise a plurality of HMDSO layers comprising the HMDSO layer,
   wherein the plurality of inorganic layers comprises at least three inorganic layers, and
   wherein one of the plurality of HMDSO layers is interposed between adjacent ones of the inorganic layers.

5. A method of manufacturing a thin film encapsulation structure of a flat panel display device, the method comprising:
   forming a plurality of inorganic layers protecting a display unit on a substrate; and
   forming a hexamethyldisiloxane (HMDSO) layer between the inorganic layers.

6. The method of claim 5, wherein a material of the inorganic layers comprises silicon nitride (SiNx) or silicon oxide (SiOx).

7. The method of claim 5, wherein the HMDSO layer has a gradient in which a density of the HMDSO layer increases away from a boundary line with respect to the inorganic layers.

8. The method of claim 5, wherein the inorganic layers and the HMDSO layer are formed in a single chamber.

9. The method of claim 5, the method further comprising forming a plurality of HMDSO layers comprising the HMDSO layer,
   wherein forming the inorganic layers comprises forming at least three inorganic layers, and
   wherein one of the plurality of HMDSO layers is formed between adjacent ones of the inorganic layers.

10. A flat panel display device comprising:
    a substrate;
    a display unit on the substrate;
    a plurality of inorganic layers covering the display unit; and
    a hexamethyldisiloxane (HMDSO) layer interposed between adjacent ones of the inorganic layers.

11. The flat panel display device of claim 10, wherein a material of the inorganic layers comprises silicon nitride (SiNx) or silicon oxide (SiOx).

12. The flat panel display device of claim 10, wherein the HMDSO layer has a gradient in which a density of the HMDSO layer increases away from a boundary line with respect to the inorganic layers.

13. The flat panel display device of claim 10, further comprising a plurality of HMDSO layers comprising the HMDSO layer,
    wherein the plurality of inorganic layers comprises at least three inorganic layers, and
    wherein one of the plurality of HMDSO layers is interposed between each of adjacent ones of the inorganic layers.

* * * * *